United States Patent
Pierre et al.

[11] Patent Number: 6,066,241
[45] Date of Patent: May 23, 2000

[54] PICKLING (ETCHING) PROCESS AND DEVICE

[75] Inventors: Vanden Brande Pierre, Brussels; Weymeersche Alain, Wavre, both of Belgium

[73] Assignee: Recherche Et Development Du Groupe Cockerill Sambre en abrege "RDCS", Liege, Belgium

[21] Appl. No.: 09/052,940

[22] Filed: Apr. 1, 1998

[30] Foreign Application Priority Data

Apr. 10, 1997 [BE] Belgium .................................. 09700329

[51] Int. Cl.[7] .................................................. C23C 14/34
[52] U.S. Cl. .......................... 204/192.32; 204/298.34; 204/298.35; 204/298.37; 204/298.2; 216/67; 156/345
[58] Field of Search ................. 204/192.32, 298.31, 204/298.16, 298.19, 298.2, 298.21, 298.22, 298.23, 298.24, 298.28, 298.37, 298.35, 298.34, 298.06; 156/345; 216/67

[56] References Cited

U.S. PATENT DOCUMENTS

| 4,526,643 | 7/1985 | Okano et al. | 156/345 |
| 4,734,621 | 3/1988 | Yonnet et al. | 315/111.41 |
| 4,896,813 | 1/1990 | Saijo et al. | 228/116 |
| 5,079,481 | 1/1992 | Moslehi et al. | 315/111.41 |
| 5,082,542 | 1/1992 | Moslehi et al. | 204/192.32 |
| 5,262,030 | 11/1993 | Potter . | |
| 5,271,788 | 12/1993 | Hasegawa et al. | 156/345 |

FOREIGN PATENT DOCUMENTS

| 0 535 568 | 4/1993 | European Pat. Off. . |
| 0 603 587 | 6/1994 | European Pat. Off. . |

*Primary Examiner*—Nam Nguyen
*Assistant Examiner*—Julian A. Mercado
*Attorney, Agent, or Firm*—Browdy and Neimark

[57] ABSTRACT

Process and device for continuously pickling at least one of the sides of a substrate (1), according to which this substrate (1) is moved according to a predetermined direction between an anode (8), with respect to which it is polarised negatively, and at least one magnetic circuit (2) disposed opposite this anode (8), the side to be pickled being directed towards the anode (8), and, in the proximity of this side, a plasma (10) is created in a gas so as to generate radicals and/or ions acting thereon, use being made of means enabling to adjust the width of the field of action of the magnetic circuit to the width of the zone of the substrate (1) which is to be pickled.

24 Claims, 5 Drawing Sheets

PICKLING (ETCHING) PROCESS AND DEVICE

The present invention relates to a continuous process for pickling or etching at least one of the sides of a substrate formed preferably by a continuous metallic strip, such as a steel sheet, according to which this substrate is moved according to a predetermined direction between an anode, with respect to which it is polarised negatively, and at least one magnetic circuit disposed opposite this anode, the side to be pickled being directed towards the anode, and, in the proximity of this side, a plasma is created in a gas so as to generate radicals and/or ions acting thereon.

The known processes show the disadvantage that, if the width of the substrate varies, the support over which this substrate is moving risks to be deteriorated by the pickling action which will also occur laterally beyond the substrate.

One of the essential objects of the present invention is to propose a process which enables to solve this important problem efficiently and in a very simple way.

To this end, use is made according to the invention of means enabling to adjust the width of the field of action of the magnetic circuit to the width of the zone of the substrate which is to be pickled, i.e. transversally to the travelling direction thereof.

Advantageously, use is made of at least one magnetic circuit, the dimensions of which in the direction transverse to the travelling direction of the substrate, are adjustable in function of the width of the zone to be pickled thereof.

According to a particular embodiment of the invention, use is made of at least two different independent magnetic circuits which are insulated from one another and which form a whole extending transversally with respect to the travelling direction of the substrate, over the entire width of the aforementioned zone which is to be pickled, at least one of these circuits being movable in a transverse direction which is transverse to the substrate in function of the width of this zone.

The invention also relates to a device for applying the process according to the invention.

It is more particularly a device which can be used for pickling substrates formed for example by continuous metallic strips having very variable widths or substrates having a width which varies from one location to another and this while avoiding that the support onto which these substrates rest, could be deteriorated by the pickling.

This device comprises means for moving the substrate according to a predetermined direction through a space provided between an anode and at least one magnetic circuit disposed opposite this anode, the side to be pickled being directed towards the anode, and means, on the one hand, for polarising the substrate negatively with respect to the anode when passing in front of this anode, and, on the other hand, for creating between the anode and the side which is to be pickled a plasma in a gas so as to generate radicals and/or ions which can act on this side.

According to the invention, other means are provided enabling to adjust the width of the magnetic action field to the width of the zone of the substrate which is to be pickled, i.e. transversally to the travelling direction thereof.

According to an advantageous embodiment, the device according to the invention comprises a support with a cylindrical surface onto which the substrate can rest during its travel and which is formed by a drum rotatably mounted around its axis, at least one magnetic circuit being arranged within the drum, opposite the location where the substrate comes into contact with the drum.

Other details and particularities of the invention will become apparent from the description given hereinafter by way of non-limitative examples of some particular embodiments of the pickling process and device according to the invention. In this description, the reference numerals relate to the annexed drawings.

In the different figures, the same reference numerals relate to identical or analogous elements.

The invention concerns first of all a continuous process for pickling one or two sides of a substrate preferably formed by a continuous metallic strip, such as a steel sheet, an aluminium foil, etc.

According to this process, this strip is moved according to a predetermined direction within a space provided between an anode, with respect to which it is polarised negatively, and at least one magnetic circuit disposed opposite this anode, the side of the strip to be pickled (etched) being directed toward the anode, and between this anode and the substrate a plasma is created in a gas, such as argon or a reactive gas, so as to generate radicals and/or ions which can act onto the side which is to be pickled.

This process is essentially characterised by the fact that use is made of means which enable to adjust, preferably automatically, the width of the field of action of the magnetic circuit to the zone to be pickled of the strip, i.e. transversally to the travelling direction thereof.

In fact, as it results already from the above, the invention aims at proposing a process which enables to limit the action of the radicals and/or ions generated in the plasma to the entire zone to be pickled of the metallic strip and only to this zone, i.e. which does not extend laterally with respect thereof, for example onto the supports for the strip provided in the pickling device. In order to obtain this result, there is needed, on the one hand, the presence of an anode opposite the surface of the zone which is to be pickled and, on the other hand, that the subjacent magnetic circuit, facing the anode, constitutes a magnetic circuit, the flux of which acts onto the entire zone and only to this zone.

This process will be illustrated further hereinafter with reference to the annexed drawings which relate to several embodiments of the device enabling to apply this process.

Figure 1:
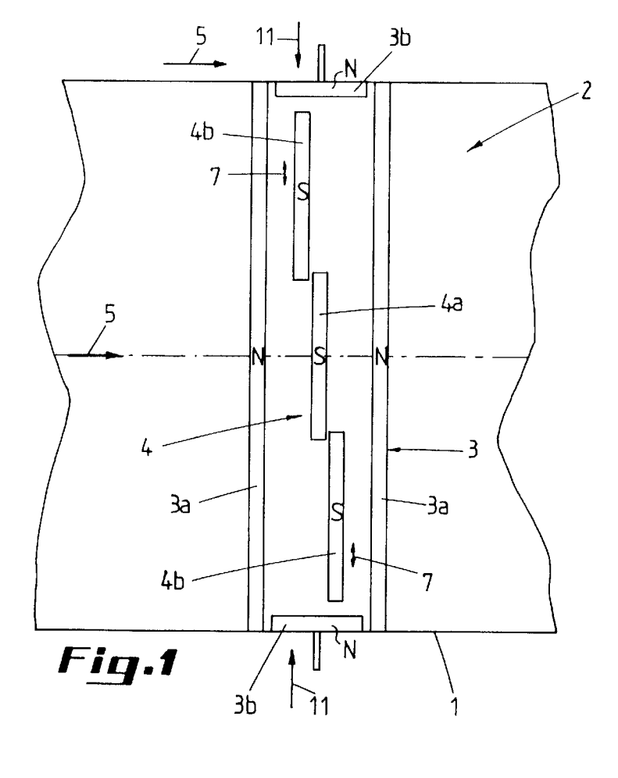
FIG. 1 is a partial schematic plan view of a first embodiment of the pickling device according to the invention.

In the embodiment illustrated by FIG. 1, a plan view is shown of a metallic strip formed for example by a steel sheet 1 showing a maximum width for this specific device and moving underneath a magnetic circuit 2 extending over this entire width, however without projecting over it.

This magnetic circuit 2 comprises permanent magnets in the form of a rectangular frame 3 forming the north pole wherein permanent magnets are arranged formed by three successive parallel bars 4 forming the south pole or vice versa and extending transversally to the travelling direction of the sheet 1, indicated by arrow 5.

Figure 3:
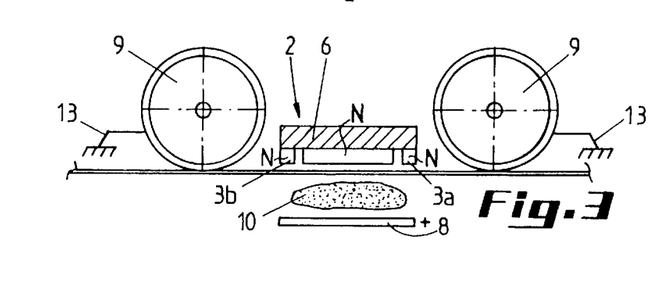
FIG. 3 is a schematic side elevational view of this first embodiment.

The central bar 4a of the south pole as well as the longitudinal sides 3a of the frame 3, forming the north pole, are fixed and are mounted onto a ferro-magnetic plate 6 as shown in FIG. 3.

The side edges 3b of the frame 3 which are parallel to the travelling direction of the sheet 1, and the bars 4b of the south pole may slide together in the direction transverse with respect to the travelling direction of the sheet, as indicated by arrows 7. So, the bars 4b are integral with the sides 3b of the frame 3 and may slide with respect to the plate 6, for example in a not shown groove applied in this plate.

A fixed anode 8 is mounted, on the opposite side of the metallic strip 1, in front of the magnetic circuit 2. This anode 8 may advantageously extend over the entire admissible maximum width of the sheet and shows a width substantially equal to the longitudinal sides 3a of the frame 3 forming the north pole. Such an anode 8 has been shown schematically in FIG. 3, which is a side view of the device shown in a plan view in FIGS. 1 and 2.

The sheet 1, which is attracted by the magnets forming the north pole 3 and the south pole 4 of the magnetic circuit 2, is maintained at a certain distance from these magnets by guiding rollers 9 extending on both sides of the magnetic circuit 2.

It has been found that good results were obtained when this distance is in the order of 0.5 cm.

In order to polarise the sheet 1 negatively with respect to the anode 8, this sheet is earthed through the intermediary of the rollers 9 as indicated schematically by references 13 on FIG. 3.

As already mentioned hereabove, the pickling of the side of the metallic strip 1 directed towards the anode 8 is obtained by creating a plasma 10 in the space provided between this anode and the metallic strip 1, as shown also in FIG. 3. This plasma generates in a gas, such as argon, ions which bombard the zone of the side which is to be pickled of the strip 1 passing between the anode 8 and the magnets 3 and 4 determining the magnetic circuit 2.

Figure 2:
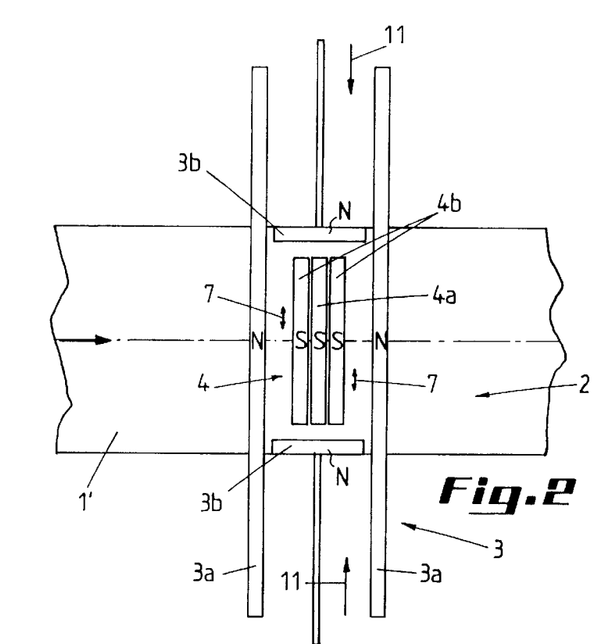
FIG. 2 is a view analogous to that of FIG. 1 of the same embodiment in another position.

FIG. 2 is a view analogous to FIG. 1 of the same device but wherein the metallic strip to be pickled shows a width which is substantially smaller than the one in FIG. 1.

In order that the pickling can only occur onto the metallic strip 1, the movable sides 3b of the frame 3 forming the north pole are brought closer together, as indicated by arrows 11, until these movable sides are situated above the lateral edges of the strip 1, as illustrated thus by FIG. 2, since the bars 4b of the south pole are integral with these sides 3b; these bars will therefore slide on both sides of the fixed bar 4a of this south pole.

If necessary, electronic means which are known per se could be provided for automatically adjusting the position of the movable parts 3b and 4b of the magnetic circuit in function of the width of the strip passing between this circuit and the anode 8. Such means have however not been shown in the figures.

Figure 4:
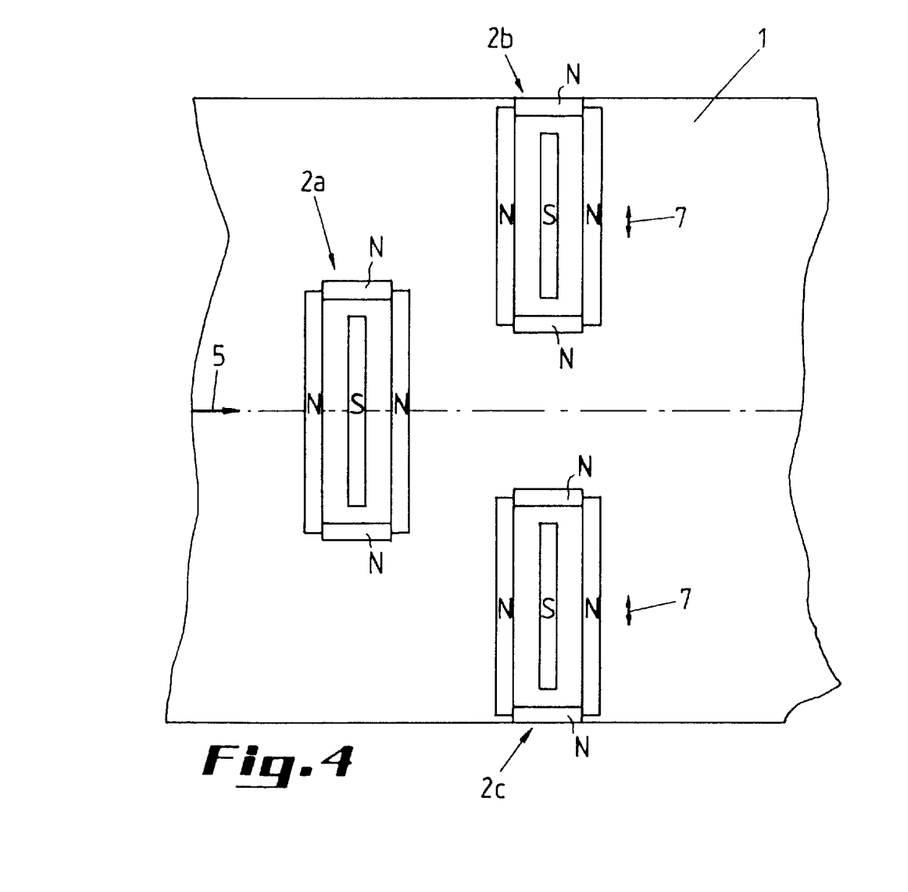
FIG. 4 is a schematic plan view, similar to that of FIGS. 1 and 2, of a second embodiment of the pickling device according to the invention.

FIG. 4 is a view, analogous to that of FIGS. 1 and 2, of a second embodiment of the pickling device according to the invention.

This embodiment is distinguished from the first embodiment by the fact that it comprises three different magnetic circuits which are insulated with respect to one another, respectively a fixed central magnetic circuit 2a and two lateral circuits 2b and 2c opposite to one another according to the axis of the metallic strip 1 and extending to the lateral edges thereof.

Another difference with respect to the first embodiment is that these magnetic circuits 2a, 2b, 2c are not adjustable in dimensions, in contract therefore to what is the case for the single circuit 2 of this first embodiment, and that the circuits 2b and 2c are movable transversally to the travelling direction of the sheet 1, as shown by arrows 7, in function of the width thereof, and this preferably independent from one another.

FIG. 4 shows the pickling of a large metallic strip, the three magnetic circuits 2a, 2b and 2c being in this case in service.

Figure 5:
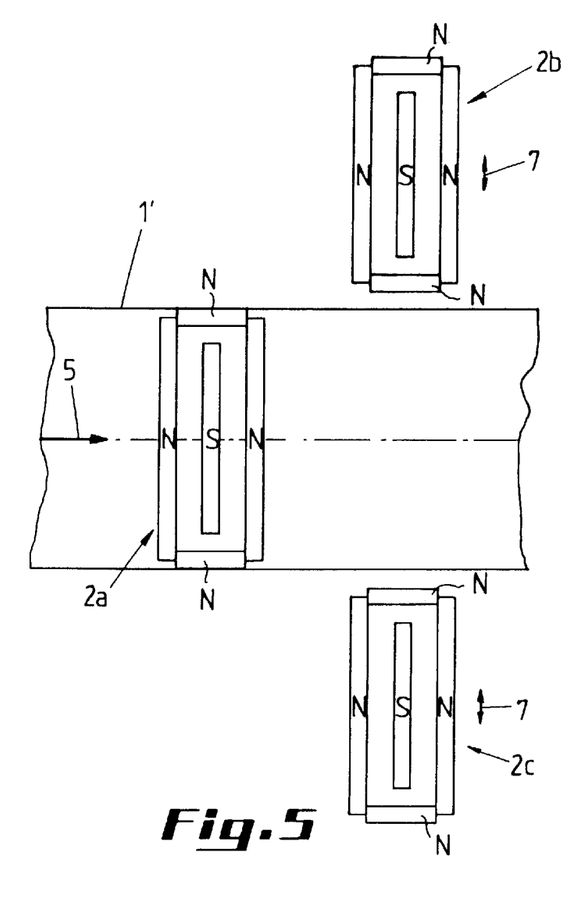
FIG. 5 is a same plan view of this second embodiment in another position.

On the contrary, in FIG. 5, which concerns the treatment of a relatively narrow metallic strip, only the central magnetic circuit 2a is in service.

Indeed, since in this case the metallic strip 1 does not travel in front of the lateral magnetic circuits 2b and 2c, these are automatically put out of service.

If the metallic strip is narrower than the dimension of the central magnetic circuit 2a in the direction of the width of the strip 1, use can be made of a magnetic circuit with variable dimensions, as shown in FIGS. 1 and 2.

Figure 6:
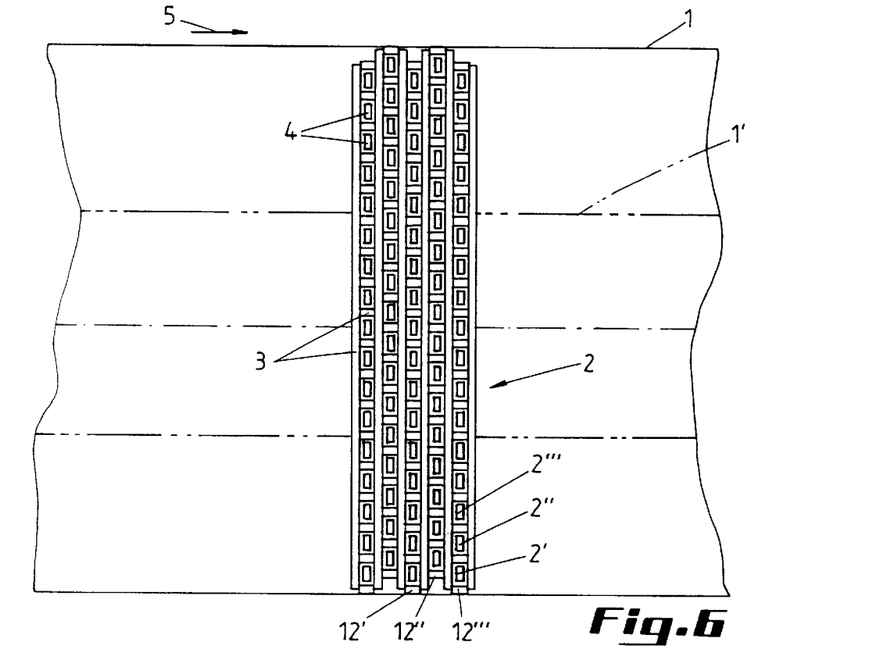
FIG. 6 is a partial schematic plan view of a third embodiment of the device according to the invention.

FIG. 6 relates to a third embodiment of the pickling device according to the invention which differs from the preceding embodiments by the fact that the magnetic circuit 2 is formed by a multicellular structure. This structure consists of a succession of independent magnetic circuits 2', 2", 2"', etc., which extend against one another in successive rows 12', 12", 12"', etc., according to the travelling direction 5 of the metallic strip 1 to be pickled and this in such a way that a magnetic circuit of one row 12" is shifted by half with respect to two successive magnetic circuits 2", 2"' of an adjacent row 12', 12"'.

The multicellular structure 2 has moreover to be insulated electrically from the sheet 1.

In fact, concretely, as can be seen when considering FIG. 6, such a circuit 2 consists of a trellis forming the north pole 3, in the meshes of which the elements forming the south pole 4 are situated, or vice versa.

In the embodiment as shown in FIG. 6, the meshes of one row are shifted with respect to the meshes of the adjacent rows over a distance corresponding to half the length of a mesh, so that the south poles of one row extend opposite a cross bar of the north pole of an adjacent row.

The size of the cells 2', 2", 2"', etc. of said multicellular structure 2 and the amplitude over which two rows adjacent cells 12' and 12"' are shifted in the transverse direction of the sheet 1 enable to determine the width of the edge zone of the sheet which will not be treated. Indeed, it has to be noted that a cell which does not extend entirely in front of the sheet, will not function. This is thus generally the case for the edge zone of the sheet. So, when the magnetic cells 2', 2" and 2"' have sufficiently small dimensions and when the shift between the cells of two adjacent rows is also sufficiently small, there will always be rows for which the cells are entirely covered by the sheet up to the edge. Consequently, it will be possible to pickle the sheet over its entire width, from edge to edge.

The smaller the thus formed cells, the better will be the adjustment precision of the total magnetic circuit in function of the width of the metallic strip to be pickled.

In a specific example of the device according to the invention, the multicellular magnetic circuit consists of four rows of cells or simple circuits of 10 cm×5 cm with a shift of 5 cm per row.

This enables to pickle sheets which are a multiple of 5 cm wide from edge to edge. On the contrary, sheets with another width will always show an untreated edge zone. For example, a sheet with a width of 62 cm will show a total untreated longitudinal zone of 2 cm. This zone may be situated in the proximity of one edge of the sheet or may be divided over the two edges.

Figure 7:
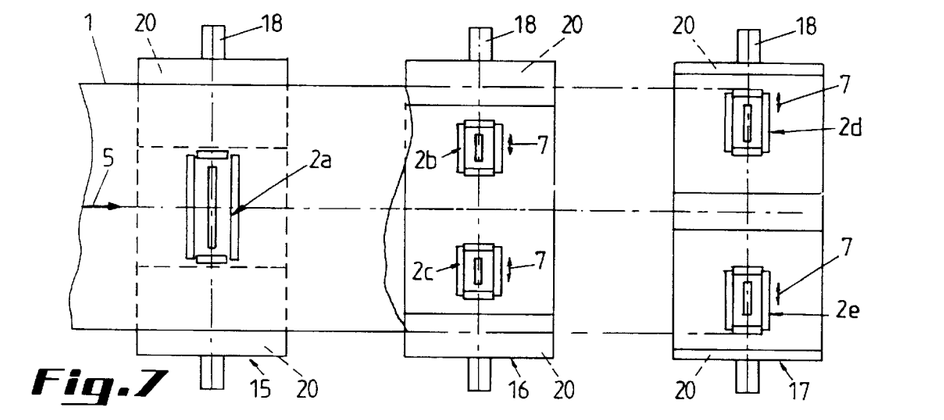
FIG. 7 is a partial schematic plan view of a fourth embodiment of the device according to the invention.
Figure 8:
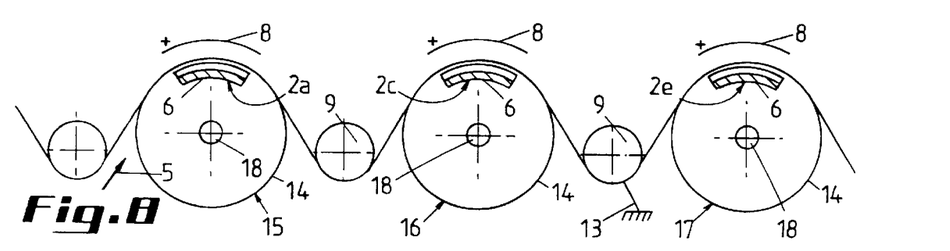
FIG. 8 is a partial schematic side elevational view of the embodiment shown in FIG. 7.

The embodiment illustrated by FIGS. 7 and 8 is essentially distinguished from the preceding ones by the fact that the metallic strip 1 rests onto the cylindrical wall 14 of three successive drums 15, 16 and 17, each rotating around an axis 18, and that the magnetic circuits 2a, 2b, 2c, 2d, 2e are successively arranged within these three drums 15 to 17, at a certain distance from the cylindrical wall 14, opposite the location where the metallic strip 1 comes into contact with this wall.

The poles 3 and 4 of these magnetic circuits 2 are mounted onto ferromagnetic 6 plates 6 which show the same centre of curvature as the drums and which are coaxial thereto.

The same goes for the anodes 8 which are arranged outside the drums, opposite the magnetic circuits.

The outer surface of the cylindrical walls 14 is coated with a layer of a non-conductive material, such as rubber or alumina, when there is a risk that a magnetic circuit should not be situated entirely below the metallic strip 1.

On both sides of each drum 15 to 17 return rollers 9 are provided having axes parallel to the drum axes 18 and permitting to apply the metallic strip firmly onto a relative large drum surface within the space between the magnetic circuits 2a, 2b, 2c, 2d, 2e and the anodes 8.

In the same way as in the previous embodiments, the metallic strip 1 is earthed, as indicated by references 13, through the return rollers 9.

The whole of the magnetic circuit comprises, in the drum 15, a fixed magnetic circuit 2a and, in the drums 16 and 17, two movable magnetic circuits 2b and 2c respectively 2d and 2e parallel to the axes 18 of the drums 16 and 17.

In this way, it is possible to adjust the width of the global magnetic field to the width of the metallic strip to be pickled.

Let us remark that in FIG. 7, in view of the clarity thereof, the return rollers 9 have not been shown.

In order to avoid bending or deformation of the wall of the drums 15, 16 and 17, especially when these show a relatively important length, reinforcements are provided within these drums, against their cylindrical wall 14.

These reinforcements are advantageously formed by inner hoops 20 supported by rigid spokes starting from the axis 18 of these drums, which spokes have not been shown in the figures.

The size and the location of these reinforcing hoops 20 is a function of the place where the magnetic circuits 2a to 2e are situated.

So, in the drum 15 containing only a fixed central magnetic circuit 2a, the hoops 20 extend from the side edges of the drums to the neighbourhood of the magnetic circuit 2a.

In the drum 16, the two end hoops 20 are narrower and a supplementary hoop may be provided in the middle of the drum when the total length of the magnetic circuits 2b and 2c is smaller than the length of circuit 2a. Finally, in the drum 17 the end hoops 20 are still narrower, whereas the central hoop 20' shows a larger width.

Figure 9:
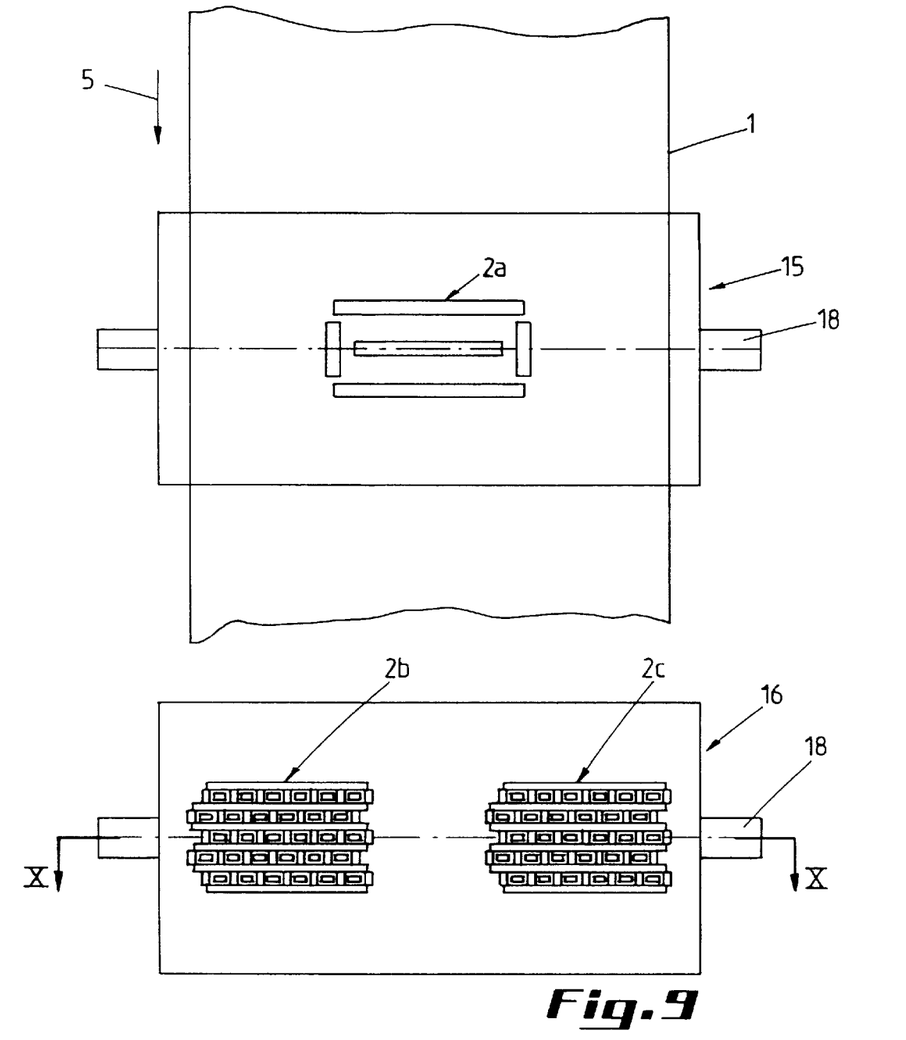
FIG. 9 is a partial schematic plan view of a fifth embodiment of the invention.
Figure 10:
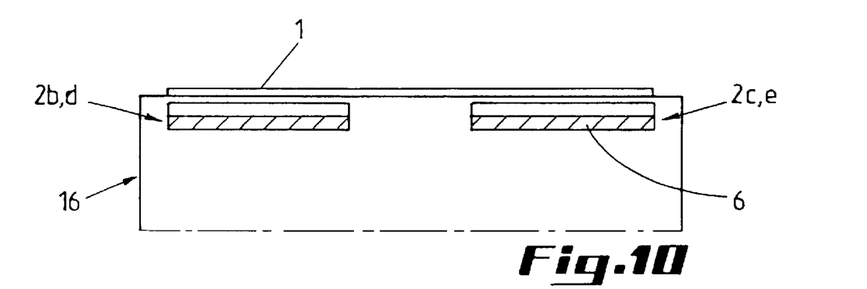
FIG. 10 is a partial cross-section according to line X—X of FIG. 9.

For the drums 16 and 17 wherein the magnetic circuits 2b to 2e are movable parallel to the axis 18, the distance between the hoops should indeed be sufficiently large to enable this displacement FIGS. 9 and 10 concern still another embodiment which can be considered as the preferred embodiment of the invention.

This embodiment is distinguished from the previous one by the fact that it comprises only two drums 15 and 16.

The drum 15 corresponds substantially entirely to the first drum 15 of the previous embodiment whereas in the drum 16 of this latter embodiment, the two conventional magnetic circuits 2b and 2c have been replaced by two multicellular circuits of the same type as those shown in FIG. 6. In this case, the drum is moreover coated with a layer of an electrically insulating material to prevent the formation of plasma onto the cylindrical surface of the drum, laterally with respect to the sheet supported thereby.

These circuits 2b and 2c can either be fixed or movable in a direction parallel to the rotation axis 18 of the drum 16.

In this latter case, the displacement of these circuits may be limited to half the dimension of a cell in this direction in order to adjust the pickling of the sheet perfectly from one edge to the other.

Moreover, both for the fixed circuits and for the movable circuits it is necessary that these latter circuits overlap always with the fixed magnetic circuit arranged in the drum 15 in such a manner that the magnetic field extends over the entire width of the metallic strip to be covered.

The fact that these circuits may be fixed or may be subjected to a relatively reduced displacement, enables to arrange within the drum 16 relatively large reinforcements, which have not been shown, without hampering these circuits, in contrast therefore to what is the case in the previous embodiment which generally requires a supplementary drum 17 for covering the same pickling width as in this latter embodiment.

In a variant of this embodiment, the fixed magnetic circuit arranged in the drum 15 could be replaced by a magnetic circuit of variable dimensions, as shown in FIGS. 1 and 2 so as to enable in this way to treat still narrower metallic strips.

In still another variant with respect to the embodiments shown in FIGS. 8 to 10, a same drum may contain two radially shifted magnetic circuits, i.e. according to the rotational direction of the drum.

One of these circuits may be situated on the left hand side and the other on the right hand side while being movable or not in a direction parallel to the drum axis.

Figure 11:
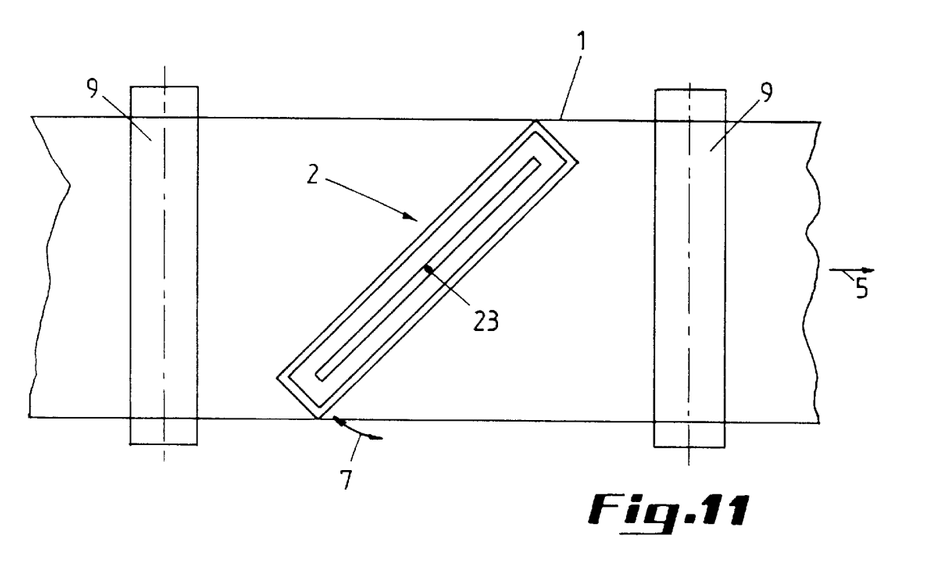
FIG. 11 is a partial schematic plan view of a sixth embodiment of the invention.

The sixth embodiment of the device according to the invention, such as shown in FIG. 11, is distinguished from the previous ones by the fact that it comprises one single magnetic circuit 2, with constant dimensions, mounted onto a not shown support which can swivel around a vertical axis 23.

So, for adjusting the magnetic circuit 2 to the width of the sheet to be pickled, this circuit has simply to be swiveled around the axis 23.

By way of variant embodiment, this magnetic circuit can be replaced by a multicellular structure or by a circuit with variable dimensions, as illustrated by certain of the previous embodiments. This embodiment is particularly advantageous for treating metallic strips of a non or slightly magnetic material, such as copper, aluminium or stainless steel.

It has to be understood that the invention is not limited to the different embodiments described hereinabove or shown in the drawings and that still other variants could be considered without leaving the scope of the invention, for example by a combination of two or more of the embodiments described hereinabove and/or shown in the annexed drawings.

The anode may for example have vary variable shapes and could for example consist of a wire. Moreover, when the strip to be pickled covers the entire width of the support onto which it rests or against which it is applied, this support could be made of an electrically conductive material, for example of steel. In fact, this may be the case for all the embodiments wherein the support does not extend opposite to a multicellular magnetic circuit like for example the embodiments according to FIGS. 1 to 5.

Moreover, this process may also be applicable to substrates formed by separate rigid plates which may travel one after the other.

We claim:

1. A continuous process for etching a side of a substrate (1) comprising a continuous metallic strip, the process comprising
moving the substrate in a travelling direction between an anode (8), with respect to which the substrate is polarized negatively, and at least one magnetic circuit (2) disposed opposite the anode (8), the side to be etched being directed towards the anode (8), and,
creating, in proximity of the side, a plasma (10) so as to generate radicals and/or ions acting on the side, and
adjusting a width of a field of action of the magnetic circuit to a width of a zone of the substrate (1) which is to be etched, the width being adjusted transversely to the travelling direction (5) thereof by moving at least a portion of the magnetic circuit in a direction transverse to the travelling direction.

2. The process according to claim 1, comprising providing at least two different independent magnetic circuits (2a, 2b, 2c, 2d, 2e) which are insulated from one another and which form a whole extending transversely with respect to the travelling direction (5) of the substrate (1), over an entire width of the zone which is to be etched.

3. The process according to claim 1, comprising using a multicellular circuit (2) comprising a succession of magnetic circuits (2', 2", 2''') of relatively reduced dimensions and extending against one another in successive rows (12', 12", 12''') transversely to the travelling direction (5) of the substrate (1).

4. The process according to claim 1, comprising using at least one magnetic circuit (2b, 2c, 2d, 2e) having a dimension, in the direction transverse to the travelling direction of the substrate, which is adjustable as a function of the width of the zone of the substrate (1) which is to be etched.

5. The process according to claim 1, comprising using magnetic circuits (2) which extend according to at least two rows (12', 12", 12''') transverse with respect to the travelling direction (5) of the substrate (1), wherein magnetic circuits of one of the rows (12") overlap with those of at least one other row, (12', 12''') when considering the travelling direction (5) of the substrate (1).

6. The process according to claim 5, comprising using identical grouped magnetic circuits (2', 2", 2''') disposed one against the other in successive rows (12', 12", 12''') according to the travelling direction (5) of the substrate (1) and in a regular bond in such a manner that a magnetic circuit from one row (12") is shifted by half with respect to successive magnetic circuits of an adjacent row (12', 12''') of magnetic circuits (2', 2", 2''').

7. The process according to claim 1, comprising moving the magnetic circuit in the direction transverse to the travelling direction via a continuous motion.

8. The process according to claim 1, wherein the continuous metallic strip includes steel.

9. A device for etching a side of a substrate (1) comprising a continuous metallic strip, the device comprising
a mover moving the substrate in a travelling direction between an anode (8) and at least one magnetic circuit (2) disposed opposite the anode (8), the side to be etched being directed towards the anode (8),
on the one hand, first apparatus polarizing the substrate negatively with respect to the anode (8) when passing in front of this anode, and, on the other hand, second apparatus creating between the anode (8) and the side which is to be etched a plasma (10) in a gas so as to generate radicals and/or ions which can act thereon, and
a width-adjusting device automatically adjusting a width of a field of action of the magnetic circuit to a width of a zone of the substrate (1) which is to be etched, in a direction transverse to the travelling direction (5).

10. The device according to claim 9, wherein the width-adjusting device comprises at least two different independent magnetic circuits (2a, 2b, 2c, 2d, 2e) which are insulated from one another and which form a whole extending transversely with respect to the travelling direction (5) of the substrate (1), over an entire width of the zone which is to be etched.

11. The device according to claim 10, wherein each magnetic circuit (2) comprises a central south pole (4) surrounded, at a certain distance, by a north pole (3), or vice versa, the poles (3, 4) being directed towards the substrate.

12. The device according to claim 11, comprising at least one magnetic circuit (2), having a dimension in the direction transverse to the travelling direction (5) of the substrate (1) which is adjustable as a function of the width of the zone to be pickled.

13. The device according to claim 12, wherein the magnetic circuit (2) is rotatably mounted around an axis (23) extending transversely to a plane in which the substrate (1) is movable opposite this circuit.

14. The device according to claim 10, comprising at least one magnetic circuit (2), having a dimension in the direction transverse to the travelling direction (5) of the substrate (1) which is adjustable as a function of the width of the zone to be pickled.

15. The device according to claim 10, comprising a central magnetic circuit (2a) which is variable or not and magnetic circuits (2b, 2c, 2d, 2e), movable or variable along the direction (7) transverse to the travelling direction (5) of the substrate (1), the variable magnetic circuits (2b, 2c, 2d, 2e) being shifted with respect to the central magnetic circuit (2a) *in the travelling direction (5) of the substrate (1)*.

16. The device according to claim 9, comprising at least one multicellular circuit (2) including a whole of separated identical magnetic circuits (2', 2", 2''') having relatively reduced dimensions and being situated against one another in successive rows (12', 12", 12''') transversely to the travelling direction (5) of the substrate (1), the magnetic circuits of one row (12") being shiftable with respect to those of adjacent rows (12', 12''').

17. The device according to claim 9, wherein the substrate (1) rests on a cylindrical surface (14) of at least one drum (15, 16, 17) rotatably mounted around a drum axis thereof (18), at least one magnetic circuit (2) being arranged within the drum opposite a location where the substrate (1) comes into contact with the drum (15, 16,17).

18. The device according to claim 17, comprising at least two drums (15, 16, 17), successive in the travelling direction (5) of the substrate (1), having parallel axes (18) extending perpendicularly to the travelling direction, over which drums the substrate travels and in each of which is arranged at least one magnetic circuit (2a, 2b, 2c, 2d, 2e).

19. The device according to claim 17, comprising on both sides of the drum (15, 16, 17) a return roller (9) for the substrate (1), the return roller having a roller axis parallel to the drum axis, in order to obtain a contact surface (19) between the drum and the substrate (1) which is as large as possible.

20. The device according to claim 18 or 19, wherein the magnetic circuit or circuits (2a) arranged in one of the drums (15) are shifted with respect to circuits arranged in the other drum (16, 17), in such a manner that all circuits cover substantially an entire width of the substrate (1).

21. The device according to claim 20, wherein one of the drums (15) comprises a fixed central magnetic circuit (2a), a dimension of which along an axial direction of the drum is at most equal to a minimum width of the surface to be etched of the substrate (1), another drum (16) comprising, in the proximity of each axial extremity thereof, a multicellular circuit (2b, 2c) which is fixed or movable in the axial direction (18) of the other drum (16) as a function of the width of the surface to be etched.

22. The device according to claim 9, wherein the magnetic circuit (2) is rotatably mounted around an axis (23) extending transversely to a plane in which the substrate (1) is movable opposite this circuit.

23. The device according to claim 9, wherein the width-adjusting device automatically adjusts the width of the field of action via a continuous motion.

24. The process according to claim 9, wherein the continuous metallic strip includes steel.

* * * * *